United States Patent
Leung et al.

(10) Patent No.: US 11,004,476 B2
(45) Date of Patent: May 11, 2021

(54) MULTI-COLUMN INTERLEAVED DIMM PLACEMENT AND ROUTING TOPOLOGY

(71) Applicant: Cisco Technology, Inc., San Jose, CA (US)

(72) Inventors: Hoi San Leung, Cupertino, CA (US); Steve Zhijian Chen, Sunnyvale, CA (US); Richard Jiang Li, San Jose, CA (US); Minh-Thanh T. Vo, San Jose, CA (US); Shameem Ahmed, Fremont, CA (US); Kenny Lieu, Milpitas, CA (US)

(73) Assignee: Cisco Technology, Inc., San Jose, CA (US)

( * ) Notice: Subject to any disclaimer, the term of this patent is extended or adjusted under 35 U.S.C. 154(b) by 1 day.

(21) Appl. No.: 16/398,861

(22) Filed: Apr. 30, 2019

(65) Prior Publication Data
US 2020/0349983 A1  Nov. 5, 2020

(51) Int. Cl.
*G11C 5/04* (2006.01)
*G11C 5/06* (2006.01)
*H05K 1/18* (2006.01)
*G06F 30/392* (2020.01)
*G06F 30/394* (2020.01)

(52) U.S. Cl.
CPC ............ *G11C 5/04* (2013.01); *G11C 5/06* (2013.01); *H05K 1/181* (2013.01); *G06F 30/392* (2020.01); *G06F 30/394* (2020.01); *H05K 2201/10159* (2013.01)

(58) Field of Classification Search
CPC . G11C 5/04; G11C 5/06; H05K 1/181; H05K 2201/10159; G06F 30/392; G06F 30/394
See application file for complete search history.

(56) References Cited

U.S. PATENT DOCUMENTS

| | | | |
|---|---|---|---|
| 9,818,457 B1* | 11/2017 | Querbach | G06F 1/18 |
| 2012/0001763 A1 | 1/2012 | Billick et al. | |
| 2018/0095909 A1 | 4/2018 | Querbach et al. | |
| 2018/0098441 A1* | 4/2018 | Truong | G11C 5/04 |
| 2018/0130505 A1* | 5/2018 | Querbach | G11C 5/04 |

OTHER PUBLICATIONS

International Search Report dated Jul. 28, 2020 in connection with PCT Application No. PCT/US2020/028409.

* cited by examiner

*Primary Examiner* — Rockshana D Chowdhury
(74) *Attorney, Agent, or Firm* — Behmke Innovation Group LLC; James M. Behmke; Jonathon P. Western

(57) ABSTRACT

In one embodiment, a printed circuit board (PCB) has a first central processing unit (CPU) socket and a second CPU socket substantially in line with the first CPU socket, and also has a first plurality of dual in-line memory module (DIMM) sockets interconnected with the first CPU socket and a second plurality of DIMM sockets interconnected with the second CPU socket (in a direction parallel to the first plurality of DIMM sockets). The first plurality of DIMM sockets are arranged on the PCB in at least a first column and a second column of DIMM sockets, and the second plurality of DIMM sockets are arranged on the PCB in at least the second column and a third column of DIMM sockets, such that the second column of DIMM sockets contains interleaved DIMM sockets from each of the first plurality of DIMM sockets and the second plurality of DIMM sockets.

20 Claims, 11 Drawing Sheets

TRADITIONAL 105 →

| LAYER | TRADITIONAL STACKUP | |
|---|---|---|
| | Material | Thk.[mils] |
| Top | Solder mask | 0.60 |
| | 0.5z+plating | 2.00 |
| | Prepreg | 2.70 |
| G02 | copper clad 0.5oz | 0.60 |
| | Core | 3.00 |
| S03 | copper clad 1oz | 1.25 |
| | Prepreg | 5.00 |
| G04 | copper clad 0.5oz | 0.60 |
| | Core | 3.00 |
| S05 | copper clad 1oz | 1.25 |
| | Prepreg | 5.00 |
| G06 | copper clad 0.5oz | 0.60 |
| | Core | 3.00 |
| S07 | copper clad 1oz | 1.25 |
| | Prepreg | 5.00 |
| G08 | copper clad 1oz | 1.25 |

MULTI-COLUMN INTERLEAVED 110 →

| LAYER | INTERLEAVED DIMM STACKUP | |
|---|---|---|
| | Material | Thk.[mils] |
| Top | Solder mask | 0.60 |
| | 0.5z+plating | 2.00 |
| | Prepreg | 2.70 |
| G02 | copper clad 0.5oz | 0.60 |
| | Core | 3.00 |
| S03 | copper clad 1oz | 1.25 |
| | Prepreg | 5.00 |
| G04 | copper clad 0.5oz | 0.60 |
| | Core | 5.00 |
| S05 | copper clad 1oz | 1.25 |
| | Prepreg | 3.00 |
| G06 | copper clad 0.5oz | 0.60 |
| | Core | 3.00 |
| S07 | copper clad 1oz | 1.25 |
| | Prepreg | 5.00 |
| G08 | copper clad 1oz | 1.25 |

FIG. 7

MULTI-COLUMN INTERLEAVED DIMM PLACEMENT AND ROUTING TOPOLOGY

TECHNICAL FIELD

The present disclosure relates generally to computer architecture, and, more particularly, to multi-column interleaved dual in-line memory module (DIMM) placement and routing topology.

BACKGROUND

Data centers use servers to provide computing resources (e.g., processing, memory space, network and disk I/O, etc.) that workloads need to function. As workloads proliferate and computing demands increase, server resources need to be expanded, or "scaled" to meet the increasing demands. There are two ways to scale server resources in a data center. The first is to add more servers or "scale-out." For example, assume an enterprise has a virtual server running five applications and using 80% of the physical server's computing capacity. If the enterprise needs to deploy more workloads and the physical server lacks sufficient computing capacity to support the additional workloads, the enterprise may need to deploy an additional server to support the new workloads. Scale-out architecture also refers to clustered or disturbed computing approaches in which multiple small servers share the computing load for a single application. For example, a mission-critical workload may be deployed on two or more servers, with the processing being shard across those servers such that if one server fails, the other can take over and maintain the application's availability. The cluster can be scaled out with additional server nodes if more redundancy is needed.

Advances in technology, as well as server computing power, have increased the amount of resources that may be provided by a single server. Today's servers have far more processing, memory, and I/O capability than previous models within a similarly sized chassis. This approach is referred to as "scale-up" because the physical server can handle more and/or larger workloads. Referring again to the example set forth above, using a scale-up approach, it is possible to deploy a new server in the next technology refresh cycle with far more computing resources, migrate all of the workloads from the old server to the new one, take the old server out of service or allocate it to other tasks and be left with significantly more available resources to tackle additional production workloads without adding significantly to data center space or energy requirements.

As one particular example, server memory demand has been increasing over time and CPU suppliers are adding more and more memory channels to address this need. However, it may not be possible to use the extra memory channels unless there is space (or "real estate") available on the printed circuit board (PCB) to accommodate additional memory slots, such as for dual in-line memory modules (DIMMs). This is particularly more difficult where smaller PCBs are used, such as for half-width form factor processor blades.

BRIEF DESCRIPTION OF THE DRAWINGS

The embodiments herein may be better understood by referring to the following description in conjunction with the accompanying drawings in which like reference numerals indicate identically or functionally similar elements, of which:

FIG. 7 is simplified block diagram illustrating example of a section of a stackup of printed circuit boards (PCBs) comparing a traditional PCB stackup to a PCB stackup for a multi-column interleaved DIMM topology according to one or more embodiments described herein;

DESCRIPTION OF EXAMPLE EMBODIMENTS

Overview

Figure 1:
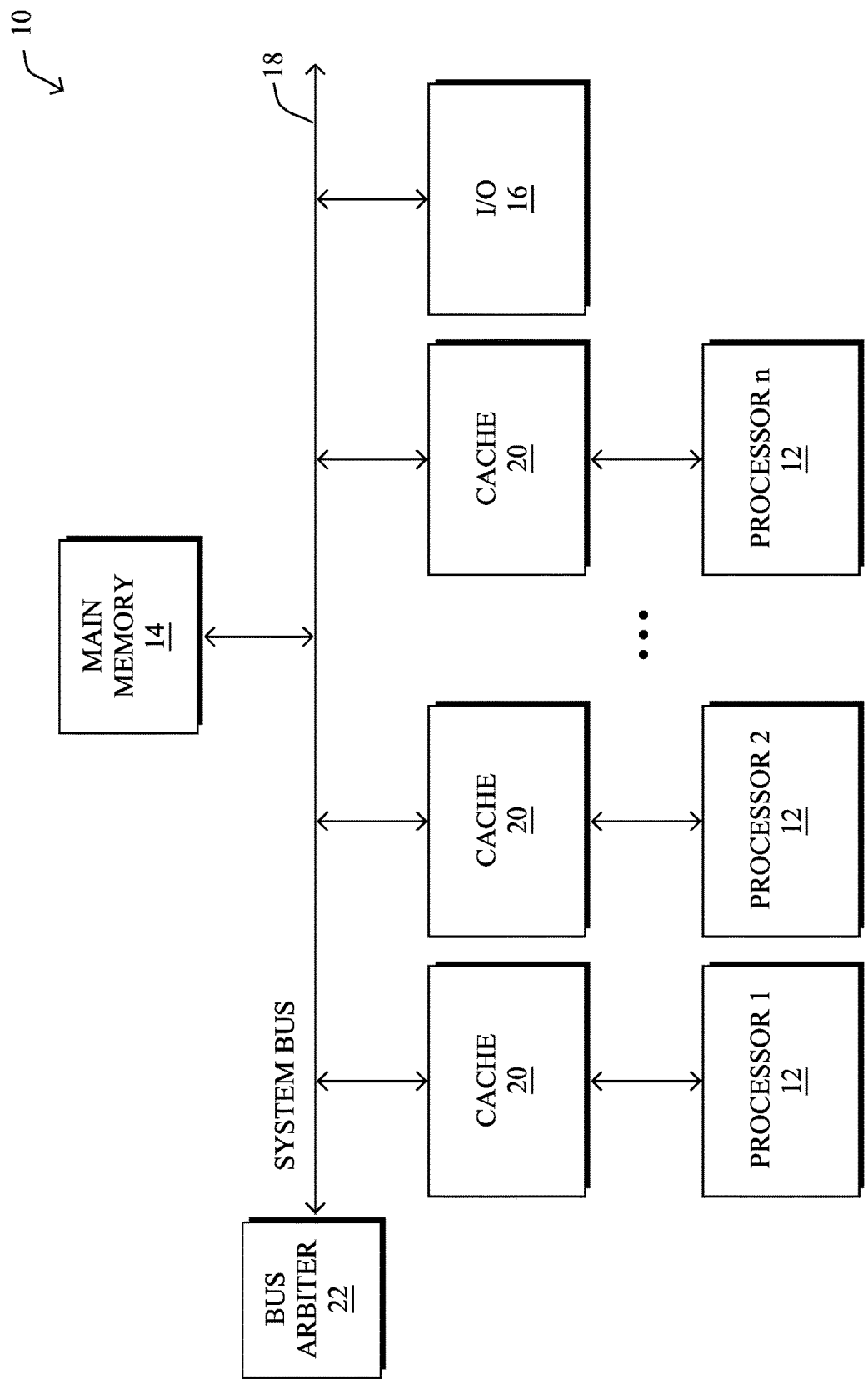
FIG. 1 is a simplified block diagram illustrating an example Symmetric Multi-Processing ("SMP") system such as may be deployed in embodiments described herein.

According to one or more embodiments of the disclosure, a printed circuit board (PCB) has a first central processing unit (CPU) socket and a second CPU socket substantially in line with the first CPU socket. The PCB also has a first plurality of dual in-line memory module (DIMM) sockets interconnected with the first CPU socket, the first plurality of DIMM sockets being on first and second opposing sides of the first CPU socket, and a second plurality of DIMM sockets interconnected with the second CPU socket, the second plurality of DIMM sockets being on first and second opposing sides of the second CPU socket and in a direction parallel to the first plurality of DIMM sockets. The first plurality of DIMM sockets are arranged on the PCB in at least a first column and a second column of DIMM sockets across both of the first and second opposing sides of the first CPU socket. The second plurality of DIMM sockets are arranged on the PCB in at least the second column and a third column of DIMM sockets across both of the first and second opposing sides of the second CPU socket, such that the second column of DIMM sockets contains interleaved DIMM sockets from each of the first plurality of DIMM sockets and the second plurality of DIMM sockets.

According to one or more additional embodiments of the disclosure, the first column and the second column are separated by a center line of the first CPU socket, and the second column and the third column are separated by a center line of the second CPU socket. In one embodiment, a portion of the first plurality of DIMM sockets closest to the first CPU socket are further arranged on the PCB on the center line of the first CPU socket, and a portion of the second plurality of DIMM sockets closest to the second CPU socket are further arranged on the PCB on the center line of the second CPU socket.

Other embodiments are described below, and this overview is not meant to limit the scope of the present disclosure.

Description

As previously noted, there are two primary types of server implementations used in data centers; namely, scale-up and scale-out. Both types of servers use multiple processors. In scale-up servers, the processors are interconnected via cache-coherent links and all work together under a single operating system software. This manner of connecting multiple processors together may also be called Symmetric Multi-Processing ("SMP") and the cache-coherent links may be referred to as SMP links. Scale-up servers are typically (but not always) used in applications in high performance databases, analytics, and compute servers. Scale-out servers, on the other hand, do not use cache-coherent links between processors and each processor subsystem works as an independent server with its own operating system software.

Implementation of scale-up servers is particularly challenging. The cache-coherent links between any two processors require a very high bandwidth (data rate) interconnect. These interconnects are realized by multiple high speed Serializer/Deserializer ("SERDES") lanes in parallel as a bundle, which is referred to as a "port." A SERDES is a pair of functional blocks often used in high speed communications to compensate for limited I/O. The SERDES blocks convert data between serial and parallel interfaces in each direction. The primary purpose of a SERDES is to provide data transmission over a single/differential line to minimize the number of I/O pins and interconnects. The SERDES function comprises two functional blocks, including a Parallel-In, Serial-Out ("PISO") block (also known as a parallel-to-serial converter), and a Serial-In, Parallel-Out ("SIPO") block (also known as a serial-to-parallel converter). The PISO block may include a parallel clock input, a set of data input lines, and input data latches. An internal or external phase-locked loop ("PLL") may be used to multiply the incoming parallel clock up to the serial frequency. The simplest form of the PISO has a single shift register that receives the parallel data once per parallel clock and shifts it out at the higher serial clock rate. The SIPO block may include a receive clock output, a set of data output lines, and output data latches. The receive clock may be recovered from the data using a serial clock recovery technique. SERDES that do not transmit a clock use a reference clock to lock the PLL to the correct TX frequency, avoiding low harmonic frequencies that may be present in the data stream. The SIP block divides the incoming clock down to the parallel rate. Typical implementations have two registers connected as a double buffer. In such implementations, one register is used to clock in the serial stream and the other is used to hold the data for the slower, parallel side.

A typical implementation may employ 20 or more SERDES lanes per port. For bidirectional communications, there may be a transmit port ("TX port") and a receive port ("RX port"). Since a scale-up system includes multiple processors, there would be multiple TX/RX port pairs per processor with each port in turn having multiple high speed SERDES lanes. This creates an enormous interconnect challenge in the system. Embodiments described herein address this interconnect challenge in designing modular scale-up server systems. In particular, embodiments described herein employ 2-way Symmetric Multiprocessor ("SMP") system implementation as a building block to realize 4-way and 8-way (and beyond) SMP systems. An SMP system is a multiprocessor system with a centralized shared memory, designated "main memory," operating under a single operating system with two or more homogenous processors.

FIG. 1 illustrates a simplified block diagram of an example conventional SMP system 10. As shown in FIG. 1, an SMP system, such as the SMP system 10, is a tightly coupled multiprocessor system with a pool of homogenous processors 12 running independently, each executing different programs on different data, with the ability to share resources, such as main memory 14 and I/O 16, and connected via a system bus or crossbar 18. Each processor 12 typically has associated therewith a private high speed cache memory 20 to speed up the main memory data access and reduce system bus traffic. A bus arbiter 22 is provided for arbitrating access to the system bus 18 by processors 12.

Figure 2:
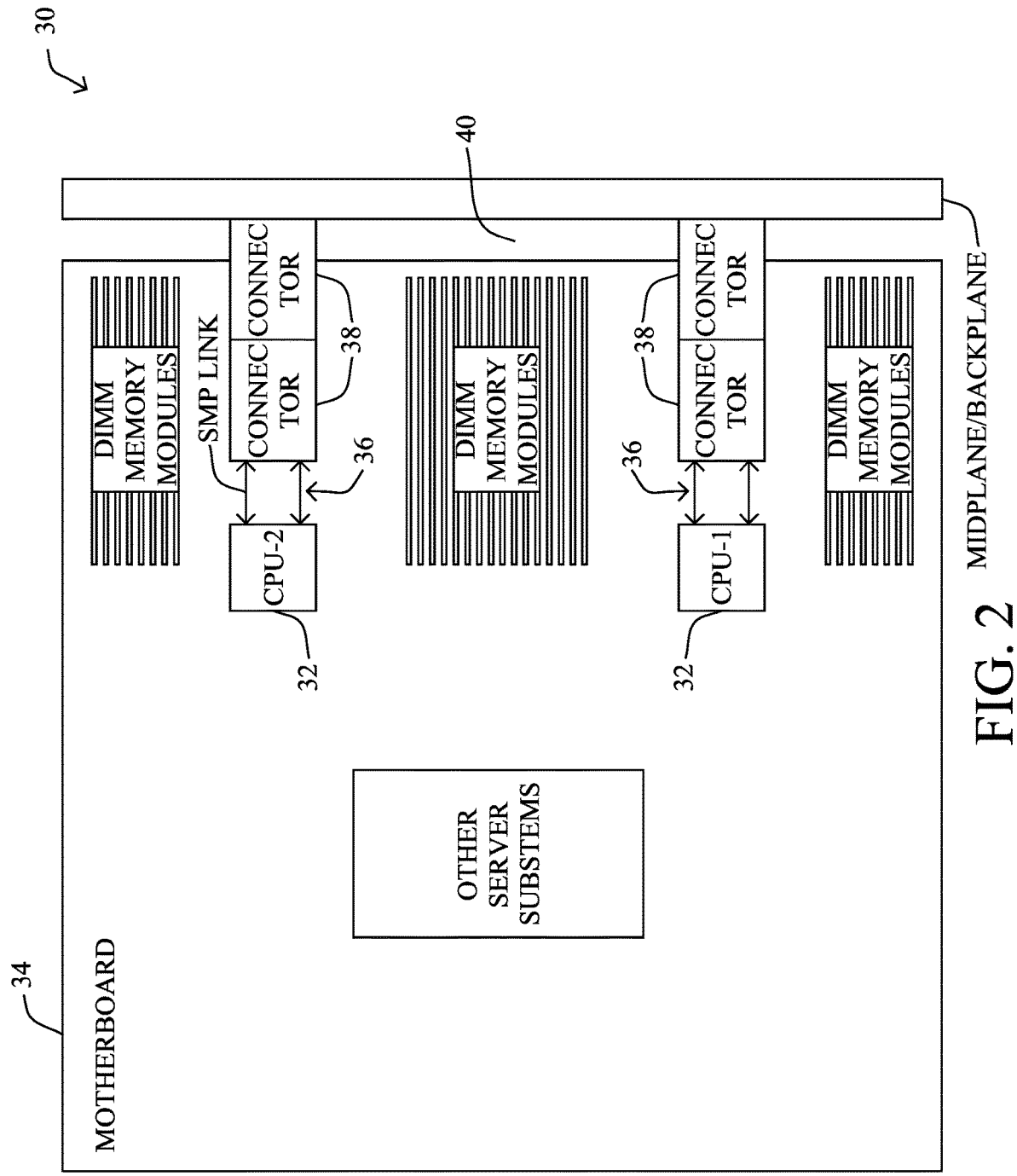
FIG. 2 is simplified block diagram illustrating a conventional arrangement of a 2-way SMP system including two processors disposed on a wide motherboard.

In accordance with features of embodiments described herein, a 2-way SMP system implementation uses only half the width of the traditional 2-way system used to realize 4-way and 8-way systems. In certain embodiments, such a half-width 2-way SMP system is realized by placing the processors one behind another along the length of the printed circuit board (known as shadow core placement). As illustrated in FIG. 2, a conventional, or traditional, 2-way SMP system 30 includes two processors, or CPUs, 32 disposed on a wide motherboard 34. Each CPU 32 includes a plurality of cache-coherent SMP links 36, all of which connect to respective connectors 38 disposed on a midplane or backplane, collectively designated in FIG. 2 by a reference numeral 40, of the server system 30. As will be described in greater detail hereinbelow, the approach illustrated in FIG. 2 requires a motherboard having twice as much width as that of a half width SMP implementation described herein. The system 30 is not configurable for 4- and 8-way SMP implementations; therefore, separate mother board designs are required for 2, 4 and 8 way SMP implementations.

In certain embodiments described herein, the cache-coherent links are split such that half of them go to the midplane (or backplane) and the other half go to the front plane disposed on the front side of the system chassis. This approach requires only smaller size connectors be used at the front side and back side, thereby enabling good air flow and regulating operating temperature of the processors and its subsystems. This arrangement also significantly reduces wiring density requirement such that the SMP links may be routed in fewer layers of printed circuit board as opposed to implementations in which all cache-coherent links are brought to front or back side. This arrangement is illustrated in FIG. 3, which illustrates a 4-way SMP system 50 in accordance with features of embodiments described herein for interconnect methods for implementing scale-up servers.

Figure 3:
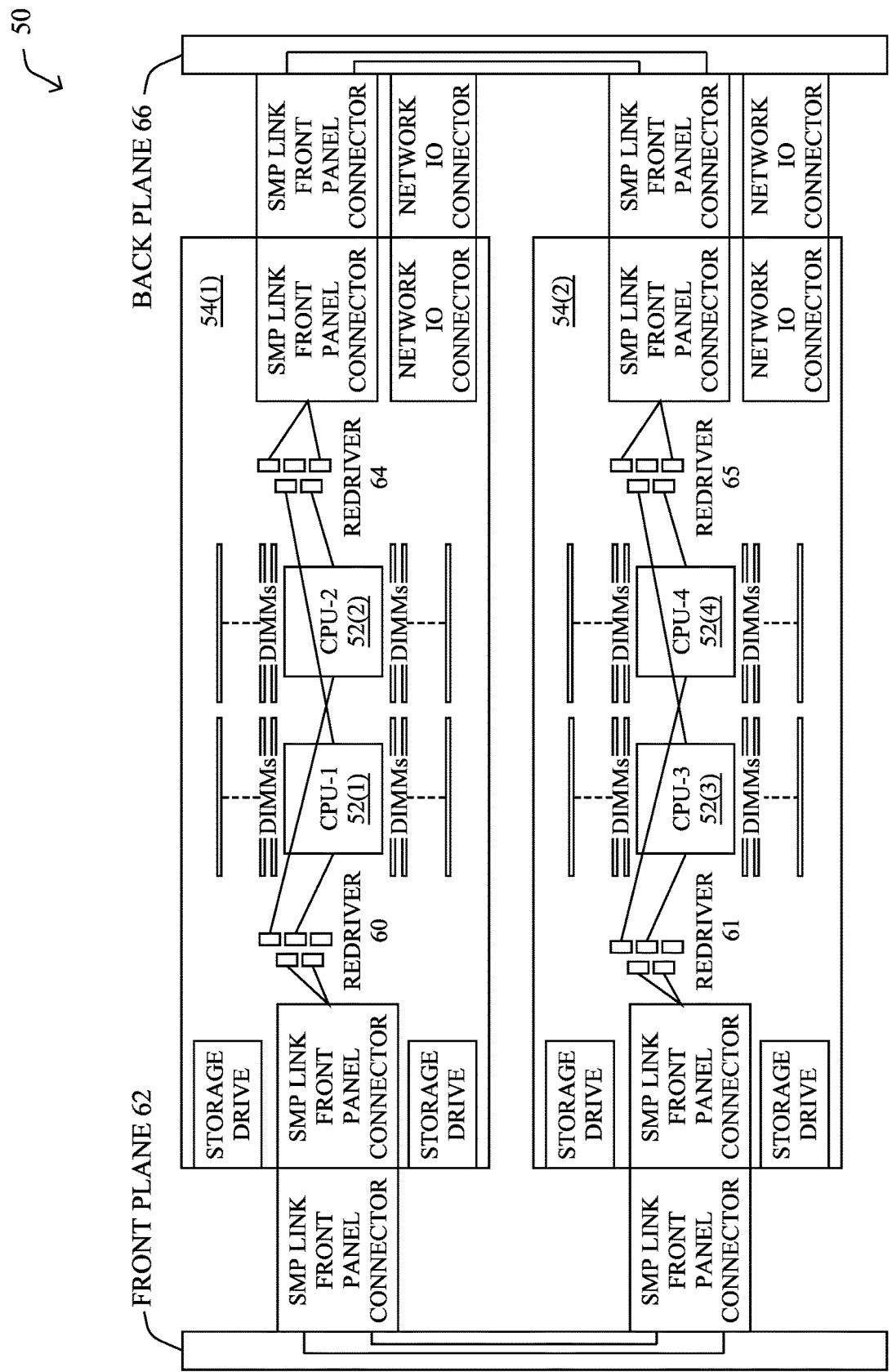
FIG. 3 is a simplified block diagram illustrating an arrangement of a 4-way SMP system in accordance with features of embodiments described herein for interconnect methods for implementing scale-up servers.

As shown in FIG. 3, the SMP system 50 includes four CPUs 52(1)-52(4), two of which (i.e., CPU 52(1) and 52(2)) are disposed on a first motherboard 54(1) and two of which (i.e., 52(3) and 52(4)) are disposed on a second identical motherboard 54(2). Each of CPUs 52(1)-52(4) has a plurality of cache-coherent links that interconnect each of the CPUs to another one of the CPUs. In accordance with features of embodiments described herein, half of the cache-coherent links in the system (i.e., a link connecting CPUs 52(1) and 52(4) and a link connecting CPUs 52(2) and 52(3)) are connected to protocol agnostic electrical redrivers

60, 61, on a front plane 62 of the system 50 chassis and the other half of the cache-coherent links (e.g., a cache-coherent link connecting CPU 52(2) and CPU 52(4) and a cache-coherent link connecting CPU 52(1) and 52(3)) are connected to redrivers 64, 65, on a backplane (or midplane) 66 of the system 50 chassis. In some implementations, protocol agnostic electrical redrivers may not be required, in which case the cache coherent links will be connected directly to the connectors. As a result, and in accordance with features of embodiments described herein, a width of each of the motherboards 54(1) and 54(2) is half that of the motherboard 34 (FIG. 2). It will be recognized that each of the motherboards 54(1), 54(2), may correspond to a blade server, or "blade."

The cache-coherent links that connect to the front plane and those that connect to the backplane are carefully selected such that the system may be easily reconfigured for 4-way and 8-way SMP implementations with a maximum distance of one hop between processors. The cache-coherent links that connect to the front side and back side tend to be longer and hence incur high signal losses causing signal integrity issues. To avoid signal integrity issues, protocol agnostic broadband electrical signal amplifiers, or redrivers (such as redrivers 60, 61, 64, 65), may be deployed to compensate for losses resulting from long lengths of interconnect media. Alternatively, certain embodiments may make use of twin axial cable ("twinax") or co-axial cable for connecting the cache-coherent links to the backplane and front/mid-plane without requiring the use of redrivers (PHY layer only). Such twinax or co-axial cables can also be used selectively to the TX/RX ports that incur highest losses, while other TX/RX ports are routed on the printed circuit boards, or motherboards. The cables can attach to the printed circuit boards either through a high density connector or be directly press fitted to the printed circuit board vias. The connectors and/or vias may be oriented in parallel to the direction of air flow to avoid its obstruction. (Note that a "via" is a copper barrel that is used to connect signals from different routing layers or to connect static power and grounds to respective planes on a PCB.)

Normally, the high speed links that connect to the backplane/mid-plane and/or front plane carry cache-coherent SMP data. However, in some scenarios in which multi-way SMP systems are not required, the same high speed links can be used to carry processor I/O traffic (e.g., PCIe data) or network data in order to expand system capabilities such as storage. 4-way and 8-way (and beyond) SMP systems are particularly challenging to implement in smaller form factors that enable higher server density. Embodiments describe herein implement a method of interconnecting SMP links in a modular 2-way processor subsystem, which in turn are used to build 4-way and 8-way systems implemented in compact form factors.

Embodiments described herein enable higher server density than traditional implementations; in particular, up to four 4-way systems and up to two 8-way systems in 6U form factors, whereas traditional systems require 10U or higher form factors for a comparable number of comparable systems. Additionally, the system can be easily reconfigured for 2-way, 4-way, and 8-way SMP implementations. Fewer printed circuit board layers are required, thereby lowering costs for the server mother boards, and the subject embodiments enable lower latency and higher performance than node concentrator or multiplexer-based implementations up to 8S.

Figure 4:
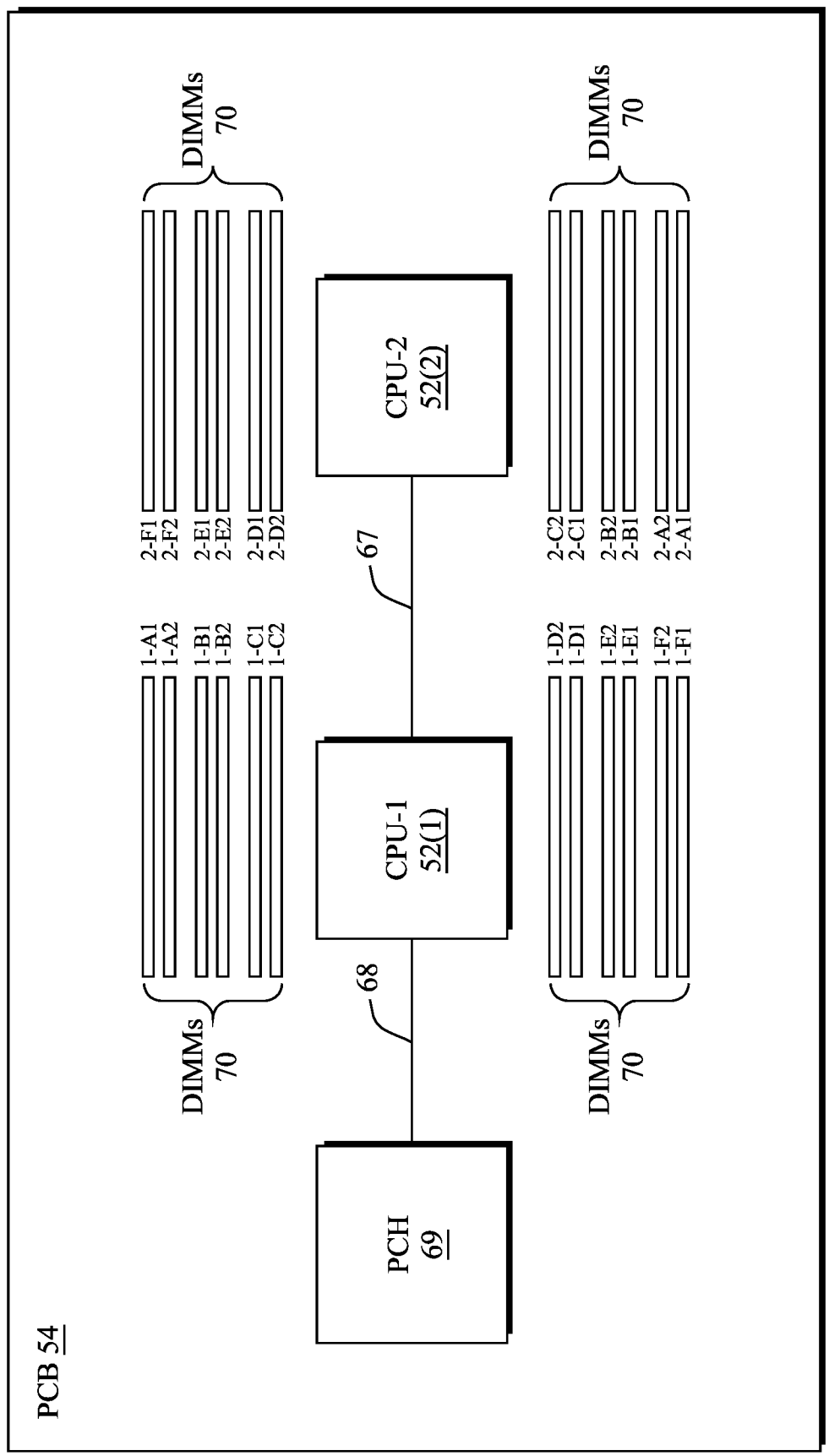
FIG. 4 is a simplified block diagram illustrating a processor complex and connections to a platform controller hub (PCH) such as may be deployed in embodiments described herein.

FIG. 4 illustrates a simplified example of a printed circuit board (PCB) (e.g., motherboard) 54, where a processor complex of two processor sockets for CPU-1 52(1) and CPU-2 52(2) are shown interconnected with an interconnect link 67, where one processor (e.g., CPU-1) is connected directly to a platform controller hub (PCH) 69 via link 68, and the second processor (e.g., CPU-2) accesses the PCH via the interface links 67 between the two CPUs. As shown, each processor has a set of DIMMs 70, listed in pairs for each processor as 1-A1/A2, 1-B1/B2, 1-C1/C2, and 1-D1/D2 for CPU-1, and as 2-A1/A2, 2-B1/B2, 2-C1/C2, and 2-D1/D2 for CPU-2. Accordingly, the half width PCB 54 in FIG. 4 can fit a total of 24 DIMMs, namely 12 (twelve) DIMMs per CPU (i.e., 6 (six) utilized "memory channels" per socket—where memory channels are independent sets of interfaces that connect a CPU with DIMMs, each memory channel holding two (or three) DIMMs). Note that the DIMMs may be RDIMM, LRDIMM, 3DS LRDIMM etc., with speeds for DDR4 or DDR5 or beyond (as developed).

Multi-Column Interleaved DIMM Placement and Routing Topology

Current PCB technology uses several different types of topology placements for placing DIMM connectors (e.g., daisy chain, tee, star, etc.) to maximize the number of DIMM connectors per memory channel for high memory capacity while operating at the highest possible frequency that the memory channel can support. However, keeping trace lengths as short as possible becomes increasingly difficult as more and more DIMM connectors are added to PCBs for higher memory capacity, as the signal trace connecting the additional DIMM connectors is lengthened in traditional topologies. Moreover, DIMM connectors that are farthest from the multi-core socket will generally set the speed at which a memory bus can operate, so adding more memory slots has traditionally meant slower memory speeds.

Double Data Rate (DDR) Synchronous Dynamic Random-Access Memory (SDRAM), in particular, has progressed over the years to reach higher and higher speeds across the generations (DDR, DDR2, DDR3, DDR4, DDR5, and further generations possibly still being developed). DDR4/5 designs, running at 2933MT/s or higher speeds, have very stringent design requirement such as: maximum trace length, trace length matching within Byte Group, trace-to-trace spacing, trace to VIA spacing, DIMM-to-DIMM spacing, PCB thickness, and GND/PWR reference for Data and Address/Cmd/Ctrl lines. These design problems are compounded due to additional memory channels and DIMM requirements. For example, data bits DQ[7:0] have 8 nets that need to be length matched with strobe nets (DQS, typically two differential pairs per byte group in a high-end CPU). If DIMM placement is not done correctly, it will significantly increase trace length as well as trace length difference among the nets, requiring more PCB real estate for length matching (or more routing layers), eventually increasing board thickness (a mechanical design constraint). Additionally, longer channel lengths will increase insertion loss and cross-talk (near and far end) that will decrease timing and voltage margins. Finally, providing ground (GND) and power (PWR) reference on Data and CLK/Cmd/Add/Ctrl groups will be extremely challenging if DIMMs are not placed properly, increasing design risks.

Figure 5:
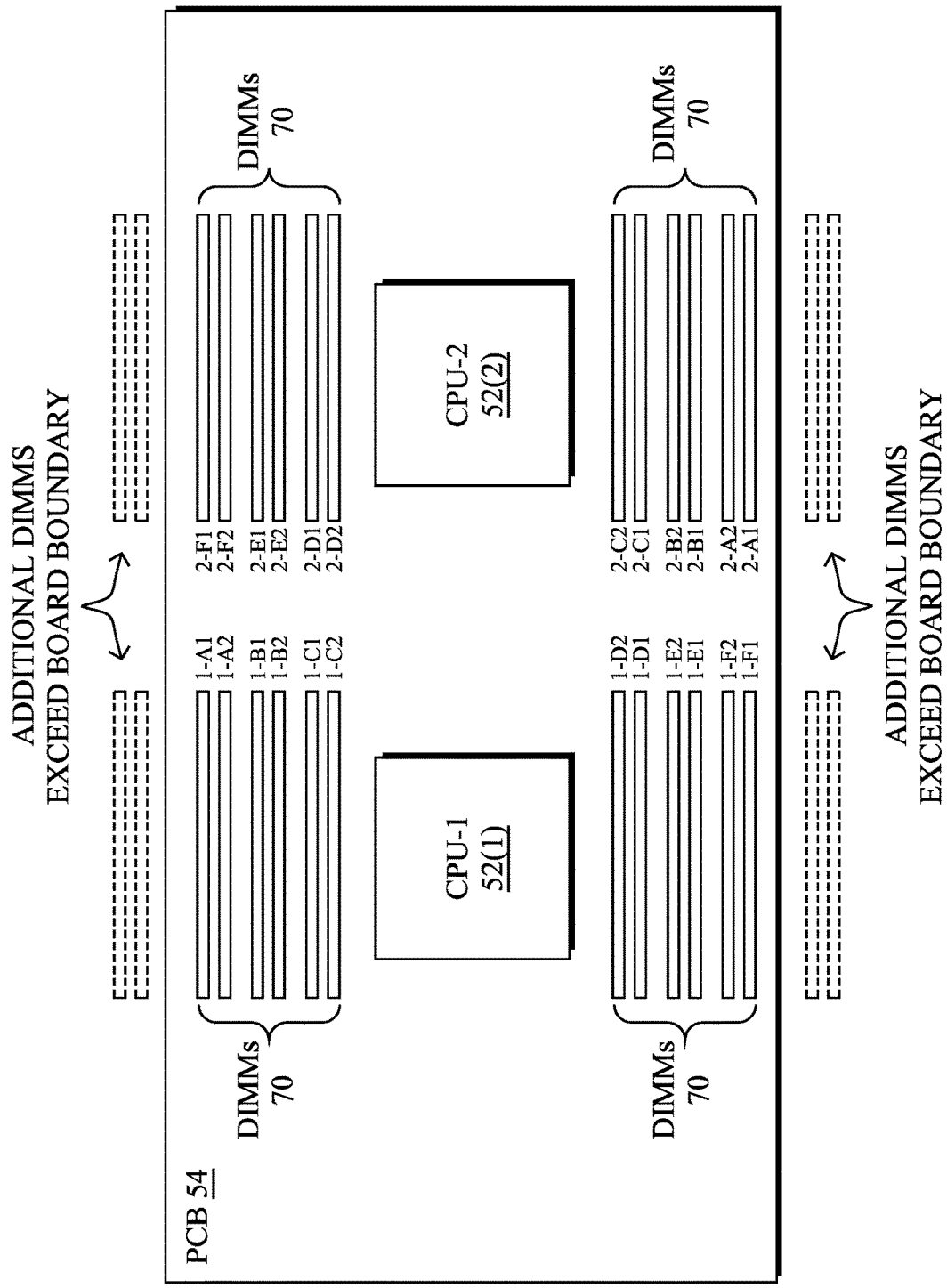
FIG. 5 is simplified block diagram illustrating difficulties with adding memory sockets to a traditional processor complex topology.

Additionally, as noted above, server memory demand has been increasing over time and CPU suppliers are adding more and more memory channels to address this need. However, space constraints on printed circuit boards (PCBs), particularly for smaller PCBs (e.g., half-width), make it difficult to accommodate additional dual in-line memory modules DIMMs. Traditional one column DIMM placement approach (as shown above in FIG. 4), which is driven by CPU pin-out, puts further constraints on the design, making it impossible to utilize extra memory channel capacity. For example, FIG. 5 illustrates how the single column topology design of FIG. 4 cannot accommodate additional DIMMs on either side of the CPU (i.e., additional DIMMs would exceed the board boundary of PCB 54) without increasing the size of the PCB (which is fixed in many design applications).

The present disclosure, therefore, provides a novel multi-column interleaved DIMM placement and routing topology by combining two unique design aspects described in greater detail below, namely multi-column DIMM placement, and DIMM interleaving (from different CPU groups). In particular, the multi-column interleaved DIMM topology herein overcomes the limitations of traditional single column DIMM topology due to PCB real estate constraints, and fully utilizes the increasing memory bandwidth and CPU capability by still meeting necessary design constraints. For example, an illustrative outcome of the embodiments described below is a half width PCB that can fit 16 (sixteen) DIMMs per CPU (eight memory channels per socket) for a total of 32 DIMMs, without increasing the size of the half-width blade. (Other sizes and total DIMM count may also be achieved using the techniques herein, and those mentioned herein are merely examples for illustration.)

Figure 6:
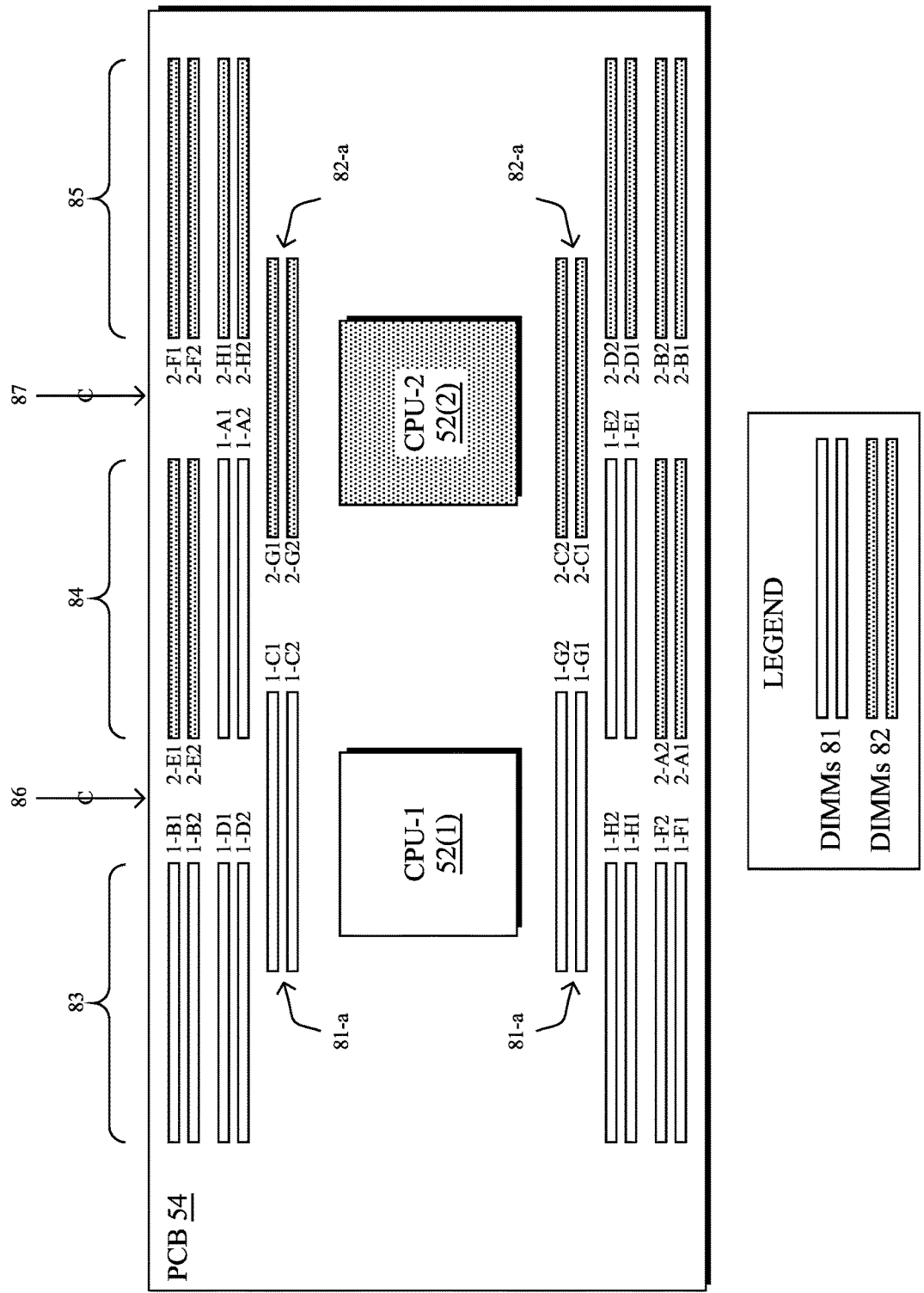
FIG. 6 is simplified block diagram illustrating multi-column interleaved dual in-line memory module (DIMM) placement and routing topology according to one or more embodiments described herein.

Operationally, FIG. 6 illustrates an example configuration according to the features of the embodiments herein for multi-column interleaved DIMMs, where white DIMMs 81 belong to CPU-1 52(1), and shaded DIMMs 82 belong to CPU-2 52(2). This unique design feature helps fit all 32 DIMMs, despite embodiments having very limited board space (e.g., half-width boards).

In particular, as shown in FIG. 6, a printed circuit board (PCB) 54 has a first central processing unit (CPU) socket 52(1), and a second CPU socket 52(2) substantially in line with the first CPU socket on the PCB. In addition, the PCB has a first plurality of dual in-line memory module (DIMM) sockets 81 interconnected with the first CPU socket 52(1) (e.g., via memory channels), where the first plurality of DIMM sockets are on first and second opposing sides of the first CPU socket, as shown. A second plurality of DIMM sockets 82 on the PCB may be interconnected with the second CPU socket 52(2), where the second plurality of DIMM sockets are also on first and second opposing sides of the second CPU socket and in a direction parallel to the first plurality of DIMM sockets. Notably, the first and second pluralities of DIMM sockets are configured for one of either Double Data Rate (DDR) generation 4 (DDR4) or DDR generation 5 (DDR5) DIMMs, or any other suitable DIMM configuration.

According to the embodiments herein, the first plurality of DIMM sockets 81 are arranged on the PCB in at least a first column 83 and a second column 84 of DIMM sockets (across both of the first and second opposing sides of the first CPU socket), while the second plurality of DIMM sockets 82 are arranged on the PCB in at least the second column 84 and a third column 85 of DIMM sockets (across both of the first and second opposing sides of the second CPU socket), such that the second column of DIMM sockets contains interleaved DIMM sockets from each of the first plurality of DIMM sockets 81 and the second plurality of DIMM sockets 82.

In one example embodiment, the first column 83 and the second column 84 are separated by a center line 86 of the first CPU socket 52(1), and the second column 84 and the third column 85 are separated by a center line 87 of the second CPU socket 52(2). In one specific embodiment, a portion of the first plurality of DIMM sockets closest to the first CPU socket (81-*a*) are further arranged on the PCB on the center line of the first CPU socket, and a portion of the second plurality of DIMM sockets closest to the second CPU socket (82-*a*) are further arranged on the PCB on the center line of the second CPU socket.

Using the illustrative pair-naming convention above, the portion of the first plurality of DIMM sockets closest to the first CPU socket 81-*a* comprises two DIMM sockets on the first side of the first CPU socket, namely 1-C1/C2, and two DIMM sockets on the second side of the first CPU socket, namely 1-G1/G2. Conversely, the portion of the second plurality of DIMM sockets closest to the second CPU socket 82-*a* comprises two DIMM sockets on the first side of the second CPU socket, namely 2-G1/G2, and two DIMM sockets on the second side of the second CPU socket, namely 2-C1/C2. (Note that the pinouts of the first and second CPU sockets may be illustratively rotated 180-degrees from each other, thus the "first sides" of the CPU sockets and the "second sides" of the CPU sockets correspond to the same side of the PCB, but electrically the pinout of the first side of the first CPU socket would correspond to the pinout of the second side of the second CPU socket.)

The first plurality of DIMM sockets 81 that are in the first column 83 may illustratively comprise four DIMM sockets on the first side of the first CPU socket 52(1), e.g., 1-B1/B2 and 1-D1/D2, as shown, and four DIMM sockets on the second side of the first CPU socket, e.g., 1-F1/F2 and 1-H1/H2. Similarly, the second plurality of DIMM sockets 82 that are in the third column 85 comprises four DIMM sockets on the first side of the second CPU socket 52(2), e.g., 2-F1/F2 and 2-H1/H2, and four DIMM sockets on the second side of the second CPU socket, e.g., 2-B1/B2 and 2-D1/D2. In this example, the first plurality of DIMM sockets 81 that are in the second column 84 comprises two DIMM sockets on the first side of the first CPU socket 52(1), e.g., 1-A1/A2, and two DIMM sockets on the second side of the first CPU socket, e.g., 1-E1/E2. Additionally, the second plurality of DIMM sockets 82 that are in the second column 84 comprises two DIMM sockets on the first side of the second CPU socket 52(2), e.g., 2-E1/E2, and two DIMM sockets on the second side of the second CPU socket, e.g., 2-A1/A2.

Based on the pinout design of the CPU sockets (the way pins on the CPU are assigned or grouped for connectivity), memory interface pins for a particular channel will generally be clustered together for connectivity purposes. As such, the illustrative layout of the DIMMs as shown in FIG. 6 provides the greatest performance with the minimal impact on functional constraints. For example, the memory channels interconnecting the first and second CPU sockets to the first and second pluralities of DIMM sockets may dictate the rotation of the pinout of the first and second CPU sockets into an orientation that provides a shortest length of a longest memory channel of the memory channels (amongst four possible rotation orientations, i.e., 90-degree increments). In addition, memory channels interconnecting the first and second CPU sockets to the first and second pluralities of DIMM sockets are configured based on the illustrative design such that a longest memory channel (e.g., to the DIMMs at the edge of the PCB) is less than or equal to the required 6.8 inches.

Notably, the PCB layer stackup design also plays an important role in system design, especially with high-performance CPUs where memory speed is typically at the highest. Certain design constraints, as shown in TABLE 1 below, must be met while designing a stackup. These constraints are driven by mechanical placement and topology, thermal airflow, and electrical parameters such as propagation delay, impedance, and cross-talk.

TABLE 1

| Constraints | Parameter |
| --- | --- |
| PCB board thickness | 140 mils (max) |
| Copper foil thickness | 1 oz for signal; 2 oz for power |
| PCB dielectric constant (DK) | ~3.4-4.0 |
| Loss tangent (Df) | ~0.0013 |
| Power planes voids | Shared by Clock groups |
| Channel length | 2.5-7.0" (max) |
| Routing layers | 22 (max) |
| DIMM pitch | 340 mils |

FIG. 7 illustrates an example of a section of a stackup (e.g., showing 8 of an illustrative 22 layers) of PCBs comparing a traditional PCB stackup (left, 105) to an example (and non-limiting) PCB stackup for a multi-column interleaved DIMM topology herein (right, 110). As can be seen, stackup 110 differs from a traditional stackup 105. Notably, near reference to G02 and G06 is used to minimize plane voids needed for CLK group signals (address, cmd, ctrl), thus minimizing layer count and thus board thickness (a traditional stackup 105 needs to create multiple plane voids for the clock group routing, shown by G02, G04, and G06). Moreover, this design helps keep the PCB thickness to less than the required 140 mils.

Figure 8A:
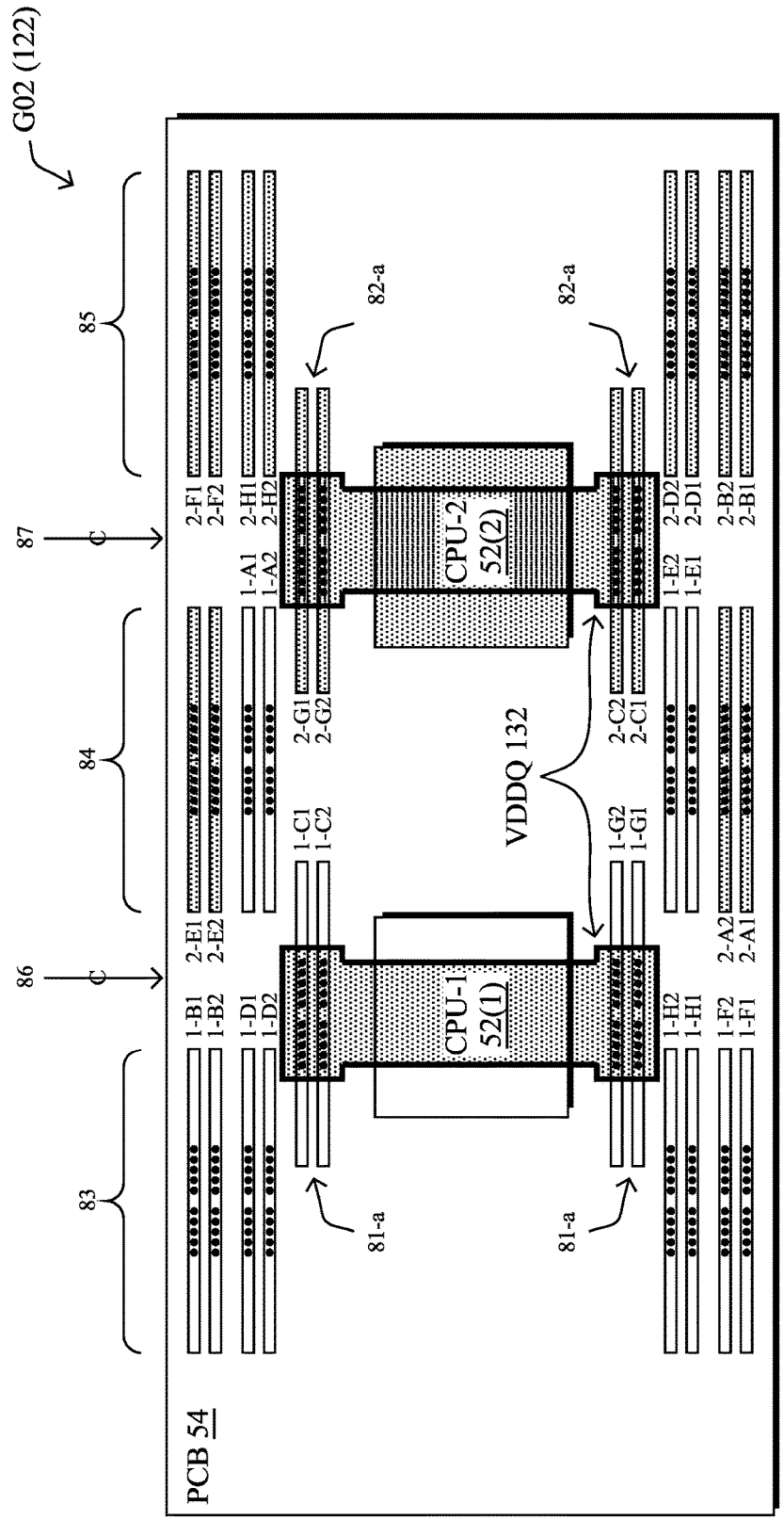
FIGS. 8A-8C are simplified block diagrams illustrating example layout views of sections of a PCB stackup for a multi-column interleaved DIMM topology according to one or more embodiments described herein.
Figure 8B:
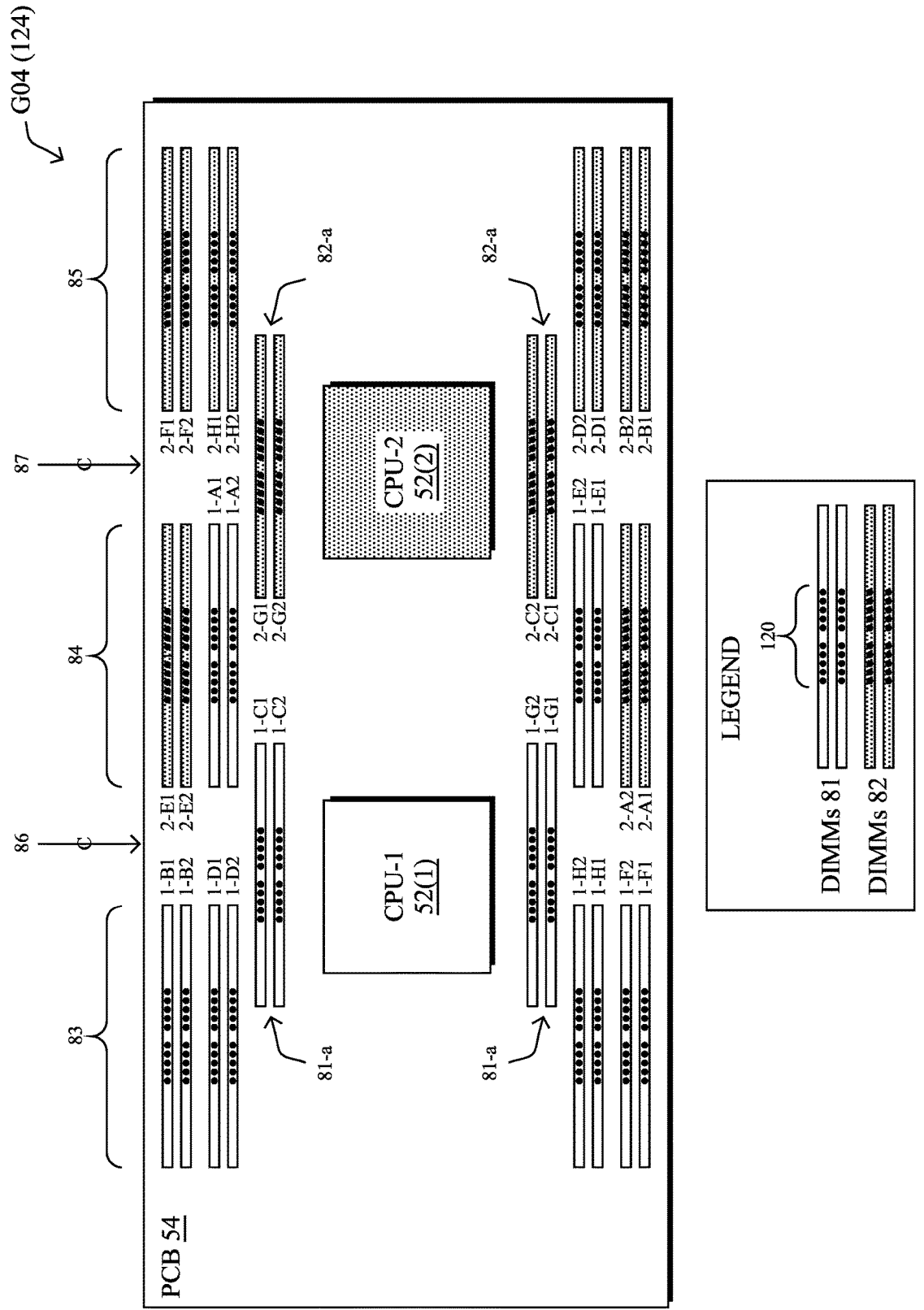
Figure 8C:
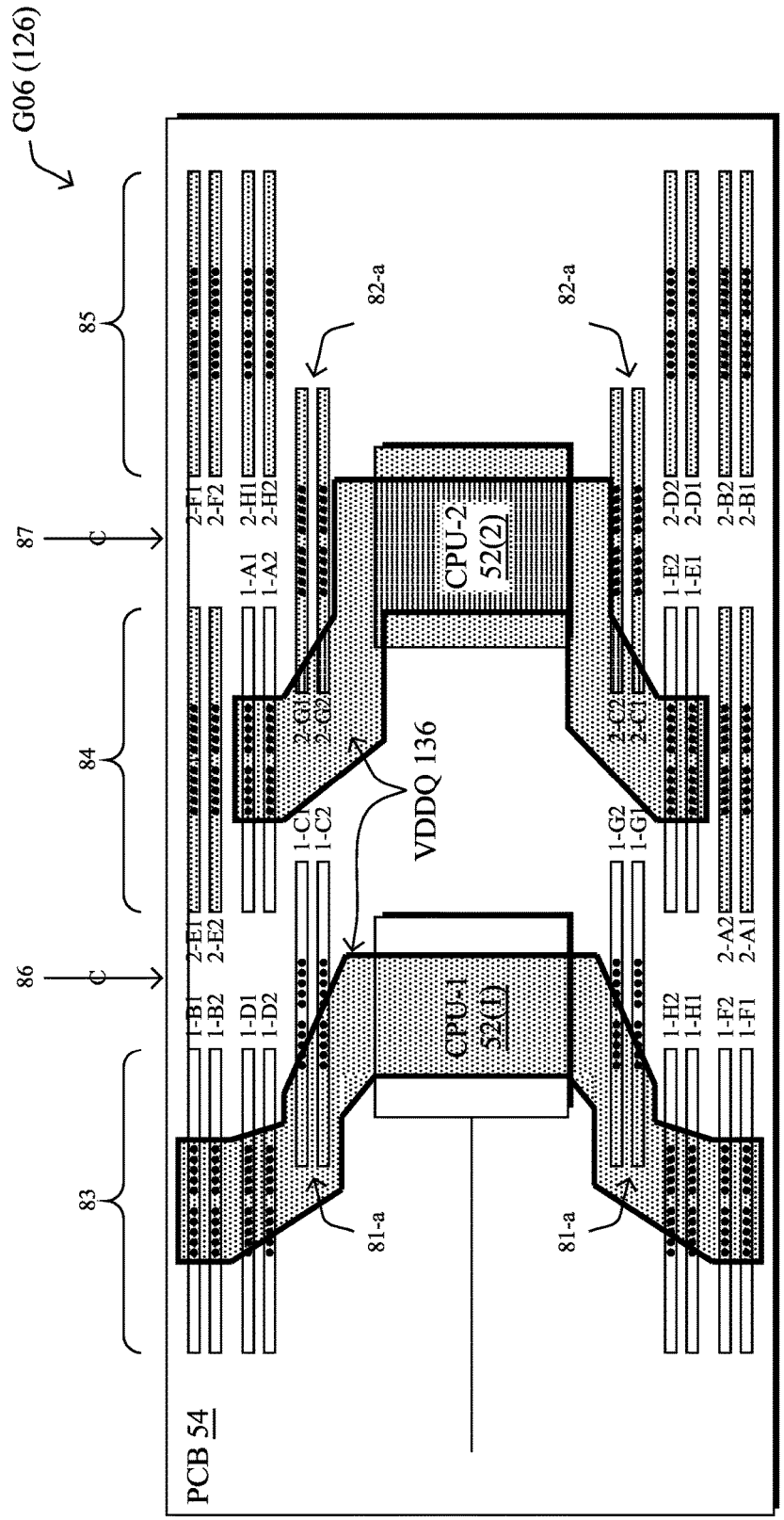

With particular regard to the near reference to G02 and G06 being used to minimize plane voids needed for CLK group signals, thus minimizing layer count and thus board thickness, as shown in FIGS. 8A-8C, for example, a simplified layout of individual layers of an illustrative PCB is shown according to the techniques herein, where in FIG. 8A, layer G02 (122) of the overall PCB 54 above is shown with a plane void 132 for VDDQ (the supply voltage to the output buffers of a memory chip, i.e., pins 120 to DIMMs 81/82) to the innermost DIMMs 81-a and 82-a. (Note that much of the remainder of the space on layers (not dedicated to other circuits) may be a ground (GND).) As shown in FIG. 8B, layer G04 (124) is shown with no plane void for VDDQ due to the illustrative stackup design herein. Finally, in FIG. 8C, layer G06 (126) is shown with plane void 136 VDDQ to respective DIMM pins 120. A traditional layer stack-up, on the other hand, would have GND plane voids filled with VDDQ (power) for Layers G02, G04 and G06. (Note that other layers are not shown for brevity, but further layout efficiencies may be established based on the illustrative layouts described herein.)

The design above thus achieves the objective of placing a larger number of DIMMs on the PCB to utilize all memory channels, while meeting electrical, mechanical, and thermal constraints in the design. That is, the multi-column interleaved DIMM design optimizes use of the PCB space to reach the full 32-DIMM configuration (for maximum performance), while maintaining support for all I/O devices on the illustrative half-width board. The design specifically considers avoidance of any mechanical constraint violations (e.g., component placement/topology, board thickness, DIMM pitch, CPU and DIMM orientation, and so on), while also meeting thermal condition requirements and minimizing (e.g., avoiding) any power distribution impact. Furthermore, electrical constraints are also met by the multi-column interleaved DIMM design, such as channel routing length, stub length between DIMM (or DIMM pitch) (where a "stub" is an extra electrical delay that can degrade signal quality on a trace stub or VIA stub), via length (which is related to board thickness), proper plane reference on Strobe and CLK groups, cross talk minimization, signal quality to meet voltage and timing margins, and so on.

The techniques described herein, therefore, provide for multi-column interleaved DIMM placement and routing topology. In particular, the embodiments herein help scale DIMM topology on a PCB with more memory channels (increasing bandwidth), where the multi-column design along with interleaved DIMMs addresses the numerous design challenges detailed above, reducing design risks significantly.

Notably, it will be recognized that the various blades shown in the drawings may be implemented using one or more computer devices comprising software embodied in one or more tangible media for facilitating the activities described herein. The computer devices for implementing the blades may also include a memory device (or memory element) for storing information to be used in achieving the functions as outlined herein. Additionally, the computer devices for implementing the blades may include one or more processors capable of executing software or an algorithm to perform the functions as discussed in this Specification. These devices may further keep information in any suitable memory element (random access memory ("RAM"), ROM, EPROM, EEPROM, ASIC, etc.), software, hardware, or in any other suitable component, device, element, or object where appropriate and based on particular needs. Any of the memory items discussed herein should be construed as being encompassed within the broad term "memory element." Similarly, any of the potential processing elements, modules, and machines described in this Specification should be construed as being encompassed within the broad term "processor." Each of the network elements can also include suitable interfaces for receiving, transmitting, and/or otherwise communicating data or information in a network environment.

Note that in certain example implementations, various functions outlined herein may be implemented by logic encoded in one or more tangible media (e.g., embedded logic provided in an application specific integrated circuit ("ASIC"), digital signal processor ("DSP") instructions, software (potentially inclusive of object code and source code) to be executed by a processor, or other similar machine, etc.). In some of these instances, a memory element can store data used for the operations described herein. This includes the memory element being able to store software, logic, code, or processor instructions that are executed to carry out the activities described in this Specification. A processor can execute any type of instructions associated with the data to achieve the operations detailed herein in this Specification. In one example, the processor could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array ("FPGA"), an erasable programmable read only memory ("EPROM"), an electrically erasable programmable ROM ("EEPROM")) or an ASIC that includes digital logic, software, code, electronic instructions, or any suitable combination thereof.

It should be noted that much of the infrastructure discussed herein can be provisioned as part of any type of network element. As used herein, the term "network element" or "network device" can encompass computers, servers, network appliances, hosts, routers, switches, gateways, bridges, virtual equipment, load-balancers, firewalls, processors, modules, or any other suitable device, component, element, or object operable to exchange information in a network environment. Moreover, the network elements may include any suitable hardware, software, components, modules, interfaces, or objects that facilitate the operations thereof. This may be inclusive of appropriate algorithms and communication protocols that allow for the effective exchange of data or information.

In one implementation, network elements/devices can include software to achieve (or to foster) the management activities discussed herein. This could include the implementation of instances of any of the components, engines, logic, etc. shown in the figures. Additionally, each of these devices can have an internal structure (e.g., a processor, a memory element, etc.) to facilitate some of the operations described herein. In other embodiments, these management activities may be executed externally to these devices, or included in some other network element to achieve the intended functionality. Alternatively, these network devices may include software (or reciprocating software) that can coordinate with other network elements in order to achieve the management activities described herein. In still other embodiments, one or several devices may include any suitable algorithms, hardware, software, components, modules, interfaces, or objects that facilitate the operations thereof.

Figure 9:
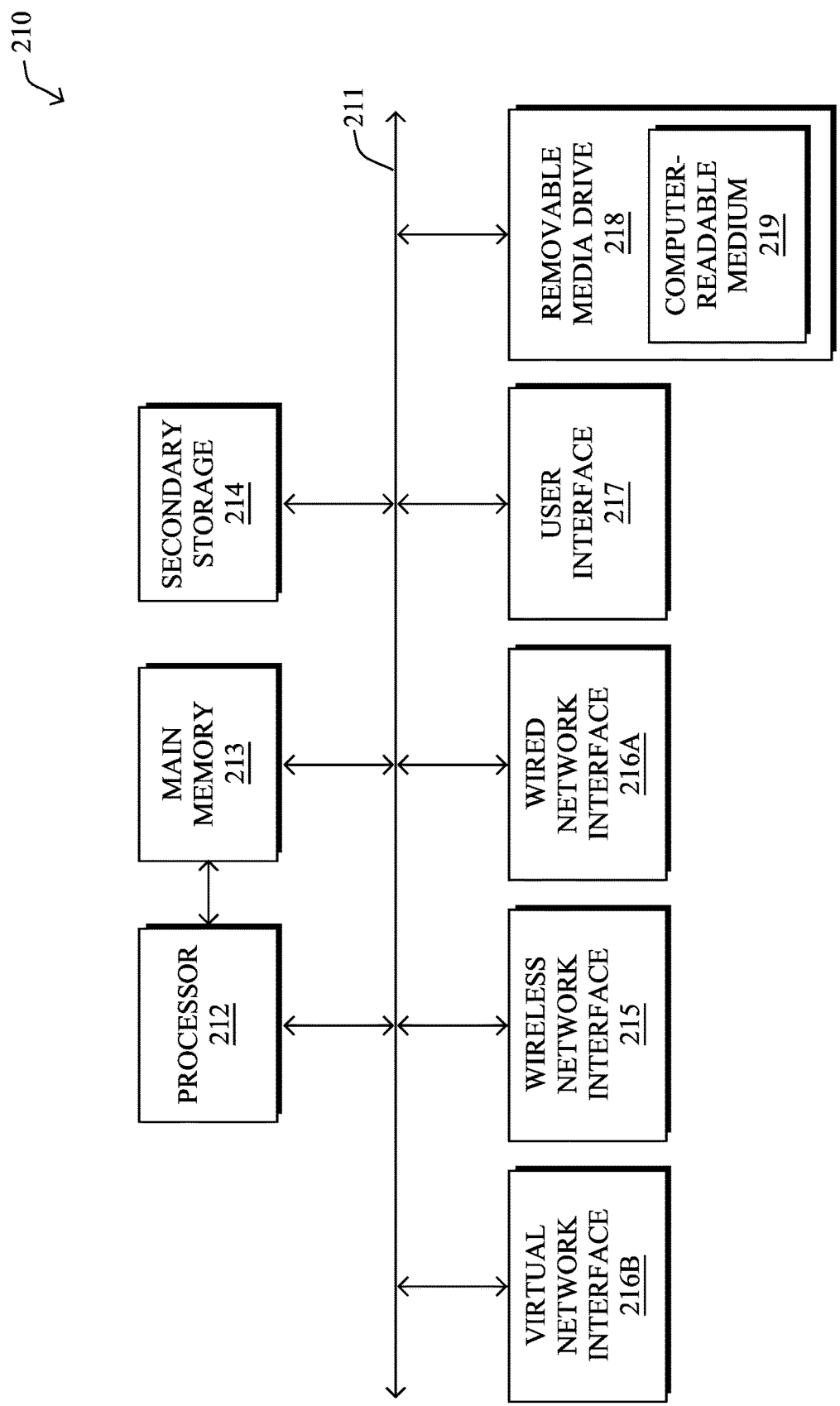
FIG. 9 is a simplified block diagram illustrating components of an example machine capable of executing instructions in a processor in a system for implementing various features of embodiments described herein.

Turning to FIG. 9, illustrated therein is a simplified block diagram of an example machine (or apparatus) 210, which in certain embodiments may comprise one of the blade servers illustrated herein, that may be implemented in embodiments illustrated in and described with reference to the figures provided herein. The example machine 210 corresponds to network elements and computing devices that may be deployed in environments illustrated in described herein. In particular, FIG. 9 illustrates a block diagram representation of an example form of a machine within which software and hardware cause machine 210 to perform any one or more of the activities or operations discussed herein. As shown in FIG. 9, machine 210 may include a processor 212, a main memory 213, secondary storage 214, a wireless network interface 215, a wired network interface 216A, a virtual network interface 216B, a user interface 217, and a removable media drive 218 including a computer-readable medium 219. A bus 211, such as a system bus and a memory bus, may provide electronic communication between processor 212 and the memory, drives, interfaces, and other components of machine 210. Machine 210 may be a physical or a virtual appliance, for example a virtual router running on a hypervisor or running within a container.

Processor 212, which may also be referred to as a central processing unit ("CPU"), can include any general or special-purpose processor capable of executing machine readable instructions and performing operations on data as instructed by the machine readable instructions. Main memory 213 may be directly accessible to processor 212 for accessing machine instructions and may be in the form of random access memory ("RAM") or any type of dynamic storage (e.g., dynamic random access memory ("DRAM")). Secondary storage 214 can be any non-volatile memory such as a hard disk, which is capable of storing electronic data including executable software files. Externally stored electronic data may be provided to computer 210 through one or more removable media drives 218, which may be configured to receive any type of external media such as compact discs ("CDs"), digital video discs ("DVDs"), flash drives, external hard drives, etc.

Wireless, wired, and virtual network interfaces 215, 216A and 216B can be provided to enable electronic communication between machine 210 and other machines or nodes via networks. In one example, wireless network interface 215 could include a wireless network controller ("WNIC") with suitable transmitting and receiving components, such as transceivers, for wirelessly communicating within a network. Wired network interface 216A can enable machine 210 to physically connect to a network by a wire line such as an Ethernet cable. Both wireless and wired network interfaces 215 and 216A may be configured to facilitate communications using suitable communication protocols such as, for example, Internet Protocol Suite ("TCP/IP"). Machine 210 is shown with both wireless and wired network interfaces 215 and 216A for illustrative purposes only. While one or more wireless and hardwire interfaces may be provided in machine 210, or externally connected to machine 210, only one connection option is needed to enable connection of machine 210 to a network.

A user interface 217 may be provided in some machines to allow a user to interact with the machine 210. User interface 217 could include a display device such as a graphical display device (e.g., plasma display panel ("PDP"), a liquid crystal display ("LCD"), a cathode ray tube ("CRT"), etc.). In addition, any appropriate input mechanism may also be included such as a keyboard, a touch screen, a mouse, a trackball, voice recognition, touch pad, and an application programming interface (API), etc.

Removable media drive 218 represents a drive configured to receive any type of external computer-readable media (e.g., computer-readable medium 219). Instructions embodying the activities or functions described herein may be stored on one or more external computer-readable media. Additionally, such instructions may also, or alternatively, reside at least partially within a memory element (e.g., in main memory 213 or cache memory of processor 212) of machine 210 during execution, or within a non-volatile memory element (e.g., secondary storage 214) of machine 210. Accordingly, other memory elements of machine 210 also constitute computer-readable media. Thus, "computer-readable medium" is meant to include any medium that is capable of storing instructions for execution by machine 210 that cause the machine to perform any one or more of the activities disclosed herein.

Not shown in FIG. 9 is additional hardware that may be suitably coupled to processor 212 and other components in the form of memory management units ("MMU"), additional symmetric multiprocessing elements, physical memory, peripheral component interconnect ("PCI") bus and corresponding bridges, small computer system interface ("SCSI")/integrated drive electronics ("IDE") elements, etc. Machine 210 may include any additional suitable hardware, software, components, modules, interfaces, or objects that facilitate the operations thereof. This may be inclusive of appropriate algorithms and communication protocols that allow for the effective protection and communication of data. Furthermore, any suitable operating system may also be configured in machine 210 to appropriately manage the operation of the hardware components therein.

The elements, shown and/or described with reference to machine 210, are intended for illustrative purposes and are not meant to imply architectural limitations of machines such as those utilized in accordance with the present disclosure. In addition, each machine may include more or fewer components where appropriate and based on particular needs and may run as virtual machines or virtual appliances. As used herein in this Specification, the term "machine" is meant to encompass any computing device or network element such as servers, virtual servers, logical containers, routers, personal computers, client computers, network appliances, switches, bridges, gateways, processors, load balancers, wireless LAN controllers, firewalls, or any other suitable device, component, element, or object operable to affect or process electronic information in a network environment.

In one example implementation, certain network elements or computing devices may be implemented as physical and/or virtual devices and may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information.

Furthermore, in the embodiments described and shown herein, some of the processors and memory elements associated with the various network elements may be removed, or otherwise consolidated such that a single processor and a single memory location are responsible for certain activities. Alternatively, certain processing functions could be separated and separate processors and/or physical machines could implement various functionalities. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In some of the example embodiments, one or more memory can store data used for the various operations described herein. This includes at least some of the memory elements being able to store instructions (e.g., software, logic, code, etc.) that are executed to carry out the activities described in this Specification. A processor can execute any type of instructions associated with the data to achieve the operations detailed herein in this Specification. In one example, one or more processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array ("FPGA"), an erasable programmable read only memory ("EPROM"), an electrically erasable programmable read only memory ("EEPROM")), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

Components of environments illustrated herein may keep information in any suitable type of memory (e.g., random access memory ("RAM"), read-only memory ("ROM"), erasable programmable ROM ("EPROM"), electrically erasable programmable ROM ("EEPROM"), etc.), software, hardware, or in any other suitable component, device, element, or object where appropriate and based on particular needs. Any of the memory items discussed herein should be construed as being encompassed within the broad term "memory element." The information being read, used, tracked, sent, transmitted, communicated, or received by network environments described herein could be provided in any database, register, queue, table, cache, control list, or other storage structure, all of which can be referenced at any suitable timeframe. Any such storage options may be included within the broad term "memory element" as used herein. Similarly, any of the potential processing elements and modules described in this Specification should be construed as being encompassed within the broad term "processor."

Note that with the numerous examples provided herein, interaction may be described in terms of two, three, four, or more network elements. However, this has been done for purposes of clarity and example only. It should be appreciated that the system can be consolidated in any suitable manner. Along similar design alternatives, any of the illustrated computers, modules, components, and elements of the figures may be combined in various possible configurations, all of which are clearly within the broad scope of this Specification. In certain cases, it may be easier to describe one or more of the functionalities of a given set of flows by only referencing a limited number of network elements. It should be appreciated that embodiments described herein, as shown in the figures, and teachings thereof are readily scalable and can accommodate a large number of components, as well as more complicated/sophisticated arrangements and configurations. Accordingly, the examples provided should not limit the scope or inhibit the broad teachings of the system as potentially applied to a myriad of other architectures.

It is also important to note that the operations and steps described with reference to the preceding figures illustrate only some of the possible scenarios that may be executed by, or within, the system. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

In the foregoing description, for purposes of explanation, numerous specific details are set forth in order to provide a thorough understanding of the disclosed embodiments. It will be apparent to one skilled in the art, however, that the disclosed embodiments may be practiced without these specific details. In other instances, structure and devices are shown in block diagram form in order to avoid obscuring the disclosed embodiments. In addition, references in the Specification to "one embodiment", "example embodiment", "an embodiment", "another embodiment", "some embodiments", "various embodiments", "other embodiments", "alternative embodiment", etc. are intended to mean that any features (e.g., elements, structures, modules, components, steps, operations, characteristics, etc.) associated with such embodiments are included in one or more embodiments of the present disclosure.

While there have been shown and described illustrative embodiments that provide for multi-column interleaved DIMM placement and routing topology, it is to be understood that various other adaptations and modifications may be made within the intent and scope of the embodiments herein. For example, while certain embodiments are described herein with respect to using certain types of memory or memory protocols, the embodiments herein are not limited as such and may be used with other types of memory, in other embodiments. In addition, while certain processing or processor protocols or terminology may have been shown, described, or implied, other suitable protocols or terminology may be used, accordingly.

The foregoing description has been directed to specific embodiments. It will be apparent, however, that other variations and modifications may be made to the described embodiments, with the attainment of some or all of their advantages. Accordingly, this description is to be taken only by way of example and not to otherwise limit the scope of the embodiments herein. Therefore, it is the object of the appended claims to cover all such variations and modifications as come within the true intent and scope of the embodiments herein.

What is claimed is:

1. An apparatus, comprising
a printed circuit board (PCB);
a first central processing unit (CPU) socket on the PCB;
a second CPU socket on the PCB and substantially in line with the first CPU socket on the PCB;
a first plurality of dual in-line memory module (DIMM) sockets on the PCB and interconnected with the first CPU socket, the first plurality of DIMM sockets being on first and second opposing sides of the first CPU socket; and
a second plurality of DIMM sockets on the PCB and interconnected with the second CPU socket, the second plurality of DIMM sockets being on first and second opposing sides of the second CPU socket and in a direction parallel to the first plurality of DIMM sockets;
wherein the first plurality of DIMM sockets are arranged on the PCB in at least a first column and a second column of DIMM sockets across both of the first and second opposing sides of the first CPU socket,
wherein the second plurality of DIMM sockets are arranged on the PCB in at least the second column and a third column of DIMM sockets across both of the first and second opposing sides of the second CPU socket, such that the second column of DIMM sockets contains interleaved DIMM sockets from each of the first plurality of DIMM sockets and the second plurality of DIMM sockets, and
wherein the second column of DIMM sockets containing the interleaved DIMM sockets from each of the first plurality of DIMM sockets and the second plurality of DIMM sockets is disposed between the first column and the third column.

2. The apparatus as in claim 1, wherein:
the first column and the second column are separated by a center line of the first CPU socket; and
the second column and the third column are separated by a center line of the second CPU socket.

3. The apparatus as in claim 2, wherein:
a portion of the first plurality of DIMM sockets closest to the first CPU socket are further arranged on the PCB on the center line of the first CPU socket; and
a portion of the second plurality of DIMM sockets closest to the second CPU socket are further arranged on the PCB on the center line of the second CPU socket.

4. The apparatus as in claim 3, wherein:
the portion of the first plurality of DIMM sockets closest to the first CPU socket comprises two DIMM sockets on the first side of the first CPU socket and two DIMM sockets on the second side of the first CPU socket; and
the portion of the second plurality of DIMM sockets closest to the second CPU socket comprises two DIMM sockets on the first side of the second CPU socket and two DIMM sockets on the second side of the second CPU socket.

5. The apparatus as in claim 1, wherein:
the first plurality of DIMM sockets that are in the first column comprises four DIMM sockets on the first side of the first CPU socket and four DIMM sockets on the second side of the first CPU socket;
the second plurality of DIMM sockets that are in the third column comprises four DIMM sockets on the first side of the second CPU socket and four DIMM sockets on the second side of the second CPU socket;
the first plurality of DIMM sockets that are in the second column comprises two DIMM sockets on the first side of the first CPU socket and two DIMM sockets on the second side of the first CPU socket, and
the second plurality of DIMM sockets that are in the second column comprises two DIMM sockets on the first side of the second CPU socket and two DIMM sockets on the second side of the second CPU socket.

6. The apparatus as in claim 1, further comprising:
memory channels interconnecting the first and second CPU sockets to the first and second pluralities of DIMM sockets;
wherein a pinout of the first and second CPU sockets are rotated on the PCB into an orientation that provides a shortest length of a longest memory channel of the memory channels amongst four possible rotation orientations.

7. The apparatus as in claim 1, further comprising:
memory channels interconnecting the first and second CPU sockets to the first and second pluralities of DIMM sockets;
wherein a longest memory channel of the memory channels is within a range between 2.0 to 7.0 inches.

8. The apparatus as in claim 1, wherein the PCB has a thickness of less than 140 mils.

9. The apparatus as in claim 1, wherein the first and second pluralities of DIMM sockets are configured for one of either Double Data Rate (DDR) generation 4 (DDR4) or DDR generation 5 (DDR5) DIMMs.

10. The apparatus as in claim 1, wherein the apparatus is a network device.

11. A printed circuit board (PCB), comprising:
a first central processing unit (CPU) socket;
a second CPU socket substantially in line with the first CPU socket;
a first plurality of dual in-line memory module (DIMM) sockets interconnected with the first CPU socket, the first plurality of DIMM sockets being on first and second opposing sides of the first CPU socket; and
a second plurality of DIMM sockets interconnected with the second CPU socket, the second plurality of DIMM sockets being on first and second opposing sides of the second CPU socket and in a direction parallel to the first plurality of DIMM sockets;

wherein the first plurality of DIMM sockets are arranged in at least a first column and a second column of DIMM sockets across both of the first and second opposing sides of the first CPU socket, wherein the second plurality of DIMM sockets are arranged in at least the second column and a third column of DIMM sockets across both of the first and second opposing sides of the second CPU socket, such that the second column of DIMM sockets contains interleaved DIMM sockets from each of the first plurality of DIMM sockets and the second plurality of DIMM sockets, and wherein the second column of DIMM sockets containing the interleaved DIMM sockets from each of the first plurality of DIMM sockets and the second plurality of DIMM sockets is disposed between the first column and the third column.

12. The PCB as in claim 11, wherein:
the first column and the second column are separated by a center line of the first CPU socket; and
the second column and the third column are separated by a center line of the second CPU socket.

13. The PCB as in claim 12, wherein:
a portion of the first plurality of DIMM sockets closest to the first CPU socket are further arranged on the center line of the first CPU socket; and
a portion of the second plurality of DIMM sockets closest to the second CPU socket are further arranged on the center line of the second CPU socket.

14. The PCB as in claim 13, wherein:
the portion of the first plurality of DIMM sockets closest to the first CPU socket comprises two DIMM sockets on the first side of the first CPU socket and two DIMM sockets on the second side of the first CPU socket; and
the portion of the second plurality of DIMM sockets closest to the second CPU socket comprises two DIMM sockets on the first side of the second CPU socket and two DIMM sockets on the second side of the second CPU socket.

15. The PCB as in claim 11, wherein:
the first plurality of DIMM sockets that are in the first column comprises four DIMM sockets on the first side of the first CPU socket and four DIMM sockets on the second side of the first CPU socket;
the second plurality of DIMM sockets that are in the third column comprises four DIMM sockets on the first side of the second CPU socket and four DIMM sockets on the second side of the second CPU socket;
the first plurality of DIMM sockets that are in the second column comprises two DIMM sockets on the first side of the first CPU socket and two DIMM sockets on the second side of the first CPU socket, and
the second plurality of DIMM sockets that are in the second column comprises two DIMM sockets on the first side of the second CPU socket and two DIMM sockets on the second side of the second CPU socket.

16. The PCB as in claim 11, further comprising:
memory channels interconnecting the first and second CPU sockets to the first and second pluralities of DIMM sockets;
wherein a pinout of the first and second CPU sockets are rotated on the PCB into an orientation that provides a shortest length of a longest memory channel of the memory channels amongst four possible rotation orientations.

17. The PCB as in claim 11, further comprising:
memory channels interconnecting the first and second CPU sockets to the first and second pluralities of DIMM sockets;
wherein a longest memory channel of the memory channels is less than or equal to 6.8 inches.

18. The PCB as in claim 11, wherein the PCB has a thickness of less than 135 millimeters.

19. The PCB as in claim 11, wherein the first and second pluralities of DIMM sockets are configured for one of either Double Data Rate (DDR) generation 4 (DDR4) or DDR generation 5 (DDR5) DIMMs.

20. The PCB as in claim 11, wherein the PCB is configured for a network device.

* * * * *